United States Patent
Xiao et al.

(10) Patent No.: US 8,711,528 B1
(45) Date of Patent: Apr. 29, 2014

(54) TUNNEL MAGNETORESISTANCE READ HEAD WITH NARROW SHIELD-TO-SHIELD SPACING

(75) Inventors: Rongfu Xiao, Dublin, CA (US); Guanxiong Li, Fremont, CA (US); Zhihong Zhang, Fremont, CA (US); Ming Mao, Dublin, CA (US); Chen-Jung Chien, Mountain View, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/538,650

(22) Filed: Jun. 29, 2012

(51) Int. Cl.
*G11B 5/39* (2006.01)

(52) U.S. Cl.
USPC .............. 360/324.11; 360/324.12; 360/122

(58) Field of Classification Search
USPC .................. 360/324–324.2, 122, 319
See application file for complete search history.

(56) References Cited

U.S. PATENT DOCUMENTS

| | | | |
|---|---|---|---|
| 5,612,098 A | 3/1997 | Tan et al. | |
| 5,717,550 A | 2/1998 | Nepela et al. | |
| 5,828,530 A * | 10/1998 | Gill et al. | 360/319 |
| 5,876,848 A | 3/1999 | Tan et al. | |
| 5,898,547 A | 4/1999 | Fontana, Jr. et al. | |
| 6,219,205 B1 | 4/2001 | Yuan et al. | |
| 6,456,465 B1 | 9/2002 | Louis et al. | |
| 6,466,419 B1 | 10/2002 | Mao | |
| 6,597,546 B2 | 7/2003 | Gill | |
| 6,631,055 B2 * | 10/2003 | Childress et al. | 360/321 |
| 6,680,828 B2 | 1/2004 | Gill | |
| 6,680,830 B2 * | 1/2004 | Gill | 360/321 |
| 6,724,584 B2 | 4/2004 | Mack et al. | |
| 6,738,236 B1 | 5/2004 | Mao et al. | |
| 6,738,237 B2 | 5/2004 | Gill | |
| 6,741,432 B2 | 5/2004 | Pinarbasi | |
| 6,744,607 B2 | 6/2004 | Freitag et al. | |
| 6,751,845 B2 | 6/2004 | Gill | |
| 6,781,798 B2 | 8/2004 | Gill | |
| 6,785,102 B2 | 8/2004 | Freitag et al. | |
| 6,801,412 B2 | 10/2004 | Gill | |
| 6,833,982 B2 | 12/2004 | Jayasekara | |
| 6,847,510 B2 | 1/2005 | Childress et al. | |
| 6,856,493 B2 | 2/2005 | Pinarbasi | |
| 6,859,348 B2 | 2/2005 | Pinarbasi | |
| 6,865,062 B2 | 3/2005 | Pinarbasi | |
| 6,867,952 B2 | 3/2005 | Hasegawa | |
| 6,867,953 B2 | 3/2005 | Gill | |
| 6,901,652 B2 | 6/2005 | Hasegawa et al. | |
| 6,933,042 B2 | 8/2005 | Gill | |
| 6,943,997 B2 | 9/2005 | Gill | |
| 6,947,264 B2 | 9/2005 | Gill | |
| 6,983,530 B2 | 1/2006 | Gill | |
| 7,016,168 B2 | 3/2006 | Li et al. | |
| 7,035,059 B2 | 4/2006 | Gill | |
| 7,035,062 B1 | 4/2006 | Mao et al. | |
| 7,037,847 B2 | 5/2006 | Le et al. | |
| 7,038,889 B2 | 5/2006 | Freitag et al. | |
| 7,050,277 B2 | 5/2006 | Gill et al. | |
| 7,072,154 B2 | 7/2006 | Gill et al. | |
| 7,082,017 B2 | 7/2006 | Freitag et al. | |
| 7,092,220 B2 | 8/2006 | Gill et al. | |

(Continued)

*Primary Examiner* — Will J Klimowicz

(57) ABSTRACT

A tunnel magnetoresistance (TMR) read sensor having a tabbed AFM layer and an extended pinned layer and methods for making the same are provided. The TMR read sensor has an AFM layer recessed from the air bearing surface, providing a reduced shield-to-shield distance.

7 Claims, 11 Drawing Sheets

(56) References Cited

U.S. PATENT DOCUMENTS

| | | |
|---|---|---|
| 7,092,221 B2 | 8/2006 | Gill |
| 7,094,130 B2 | 8/2006 | Cyrille et al. |
| 7,161,773 B2 * | 1/2007 | Fontana et al. ............ 360/324.1 |
| 7,171,741 B2 | 2/2007 | Gill |
| 7,177,120 B2 | 2/2007 | Freitag et al. |
| 7,196,878 B2 | 3/2007 | Fox et al. |
| 7,212,384 B1 | 5/2007 | Stoev et al. |
| 7,220,499 B2 | 5/2007 | Saito et al. |
| 7,245,463 B2 | 7/2007 | Gill |
| 7,248,447 B2 | 7/2007 | Gill |
| 7,265,946 B2 | 9/2007 | Gill |
| 7,268,980 B2 | 9/2007 | Gill |
| 7,280,325 B1 | 10/2007 | Pan |
| 7,313,856 B2 | 1/2008 | Gill |
| 7,324,310 B2 | 1/2008 | Gill |
| 7,330,339 B2 | 2/2008 | Gill |
| 7,345,854 B2 | 3/2008 | Takano |
| 7,365,949 B2 | 4/2008 | Hayakawa et al. |
| 7,369,371 B2 | 5/2008 | Freitag et al. |
| 7,370,404 B2 | 5/2008 | Gill et al. |
| 7,372,674 B2 | 5/2008 | Gill |
| 7,382,589 B2 | 6/2008 | Lin et al. |
| 7,405,908 B2 | 7/2008 | Gill |
| 7,405,909 B2 | 7/2008 | Gill |
| 7,419,610 B2 | 9/2008 | Cyrille et al. |
| 7,420,787 B2 | 9/2008 | Freitag et al. |
| 7,420,788 B2 | 9/2008 | Pinarbasi |
| 7,436,637 B2 | 10/2008 | Pinarbasi |
| 7,436,638 B1 | 10/2008 | Pan |
| 7,463,459 B2 | 12/2008 | Ding et al. |
| 7,466,524 B2 | 12/2008 | Freitag et al. |
| 7,469,465 B2 | 12/2008 | Ding et al. |
| 7,522,391 B2 | 4/2009 | Freitag et al. |
| 7,522,392 B2 | 4/2009 | Carey et al. |
| 7,580,230 B2 | 8/2009 | Freitag et al. |
| 7,599,155 B2 | 10/2009 | Saito et al. |
| 7,602,589 B2 | 10/2009 | Freitag et al. |
| 7,616,411 B2 * | 11/2009 | Gill ............................ 360/324.12 |
| 7,652,856 B2 | 1/2010 | Pinarbasi |
| 7,663,846 B2 | 2/2010 | Freitag et al. |
| 7,676,905 B2 | 3/2010 | Pinarbasi |
| 7,697,242 B2 | 4/2010 | Gill |
| 7,800,867 B2 | 9/2010 | Saito et al. |
| 7,916,435 B1 | 3/2011 | Gill |
| 7,961,440 B2 | 6/2011 | Gill et al. |
| 8,068,317 B2 | 11/2011 | Gill |
| 8,104,166 B1 | 1/2012 | Zhang et al. |
| 8,149,548 B2 | 4/2012 | Hatatani et al. |
| 8,233,248 B1 | 7/2012 | Li et al. |
| 8,266,785 B2 | 9/2012 | Freitag et al. |
| 8,318,030 B2 | 11/2012 | Peng et al. |
| 8,333,898 B2 | 12/2012 | Brown et al. |
| 8,343,319 B1 | 1/2013 | Li et al. |
| 8,400,738 B2 | 3/2013 | Covington et al. |
| 8,531,801 B1 | 9/2013 | Xiao et al. |
| 2002/0131219 A1 | 9/2002 | Mack et al. |
| 2003/0123198 A1 | 7/2003 | Sugawara et al. |
| 2003/0179520 A1 | 9/2003 | Hasegawa |
| 2004/0061983 A1 | 4/2004 | Childress et al. |
| 2004/0166368 A1 | 8/2004 | Gill et al. |
| 2006/0023375 A1 | 2/2006 | Gill |
| 2006/0092582 A1 | 5/2006 | Gill et al. |
| 2006/0230601 A1 | 10/2006 | Gill et al. |
| 2006/0232893 A1 | 10/2006 | Gill et al. |
| 2006/0285259 A1 | 12/2006 | Gill et al. |
| 2008/0180863 A1 | 7/2008 | Gill |
| 2009/0086385 A1 | 4/2009 | Gill et al. |
| 2009/0316308 A1 | 12/2009 | Saito et al. |
| 2010/0232072 A1 | 9/2010 | Dimitrov et al. |
| 2011/0228428 A1 | 9/2011 | Dimitrov et al. |
| 2012/0134057 A1 | 5/2012 | Song et al. |
| 2012/0276415 A1 | 11/2012 | Sapozhnikov et al. |
| 2013/0082696 A1 | 4/2013 | Le et al. |
| 2013/0092654 A1 | 4/2013 | Balamane et al. |

* cited by examiner

TUNNEL MAGNETORESISTANCE READ HEAD WITH NARROW SHIELD-TO-SHIELD SPACING

TECHNICAL FIELD

This invention relates to the field of disk read/write heads and more specifically, to tunnel magnetoresistance (TMR) read heads and method of fabricating the same.

BACKGROUND

Increasing magnetic recording density requires narrower-track widths and narrower shield-to-shield spacing on read heads. Current tunnel magnetoresistance (TMR) read heads comprise a pinned layer coupled to an antiferromagnet (AFM) layer. The TMR read heads further comprise a free layer separated from the pinned layer by a barrier layer. Current attempts to narrow the shield-to-shield spacing by removing the AFM layer have been unsuccessful because AFM-free TMR read heads are prevalently magnetically bi-directional

BRIEF DESCRIPTION OF THE DRAWINGS

The present invention is illustrated by way of example, and not limitation, in the figures of the accompanying drawings in which.

DETAILED DESCRIPTION

In the following description, numerous specific details are set forth, such as examples of specific layer compositions and properties, to provide a thorough understanding of various embodiment of the present invention. It will be apparent however, to one skilled in the art that these specific details need not be employed to practice various embodiments of the present invention. In other instances, well known components or methods have not been described in detail to avoid unnecessarily obscuring various embodiments of the present invention.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Figure 1:
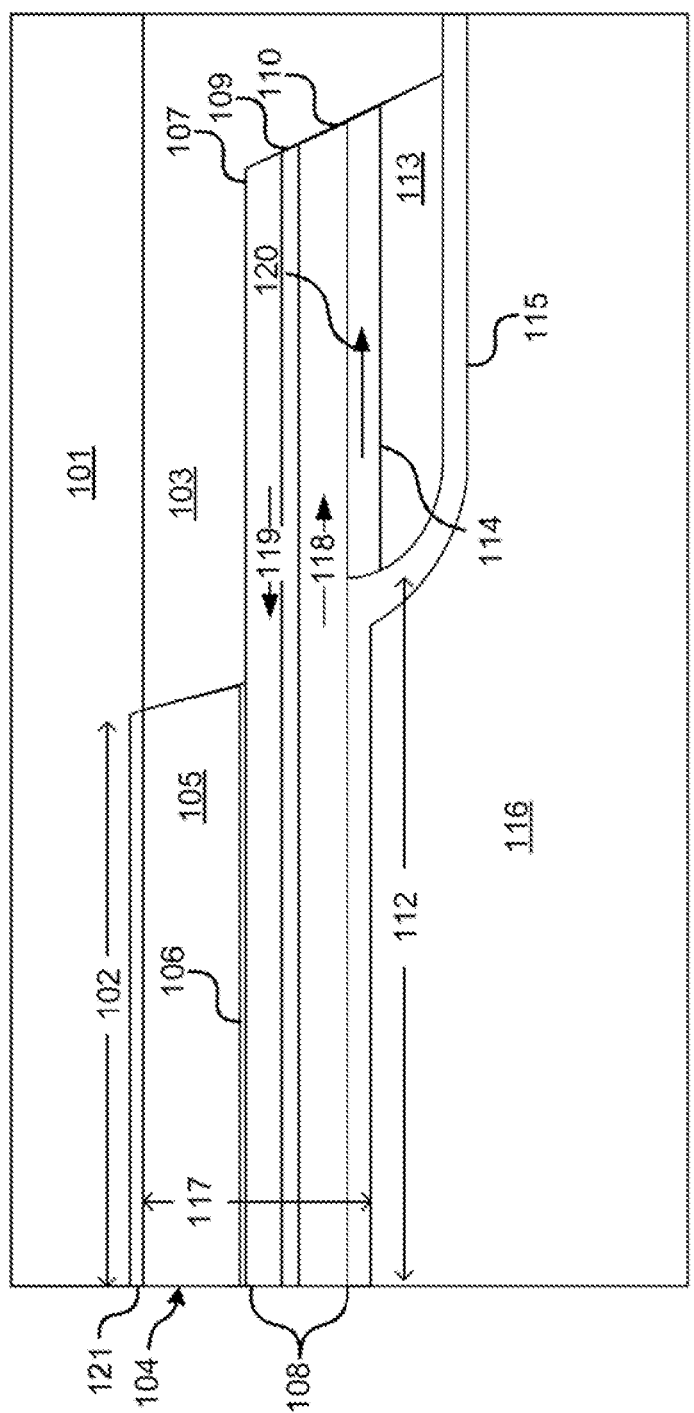
FIG. 1 illustrates a read sensor having a tabbed antiferromagnet (AFM) layer and extended pinned layer.

FIG. 1 illustrates a tunnel magnetoresistance (TMR) read sensor having a tabbed AFM layer and an extended pinned layer. The read sensor has an air-bearing surface plane (ABS) 104 and a plurality of layers perpendicular to the ABS 104. A shield layer 116 is disposed over a substrate. The shield layer 116 comprises NiFe or another conventional magnetic shield material for TMR read sensors. In some cases, the shield layer 116 is composed of a single shield material. In other cases, the shield layer 116 has a composite structure. For example, shield layer 116 may comprise one or more layers of NiFe, NiFe multilayers, CoFe, or Ru. A top shield 101 is disposed over the TMR read sensor layers. The top shield layer 101 may also comprise NiFe or other conventional material for TMR read sensors. For example, the top shield 101 may have a composition similar to the lower shield layer 116. The shield-to-shield distance 117 is the distance between the first shield layer 116 and the top layer 101 at the ABS 104.

A seed layer 115 is disposed on the shield layer 116. The seed layer may comprise Ta, Ru, a Ta/Ru bilayer or other conventional seed layers. An antiferromagnetic layer 113 (AFM layer) is disposed over the shield layer 116 on the seed layer 115. An antiferromagnet exchange biased pinned layer 114 (or "stitching layer") is disposed over the AFM layer 113. The AFM layer 113 and stitching layer 114 are recessed from the ABS 104 by a recess distance 112. Because the AFM layer 113 and stitching layer 114 are recessed from the ABS, the layers do not contribute to the shield-to-shield distance 117. In particular cases, the recess distance may be between 10 and 500 nm.

The AFM material layer 113 may comprise various anti-ferromagnetic materials, such as IrMn, PtMn, PdMn, NiMn, RhMn, or RhRuMn. IrMn is often used in TMR AFM layers because it provides a thinner AFM layer than other materials. Because the AFM layer 113 is recessed 112 from the ABS 104, thicker AFM layers 113 may be employed than in conventional TMR sensors without increasing shield-to-shield distance 117. Accordingly, other antiferromagnetic materials besides IrMn may be used without increasing shield-to-shield distance 117.

The stitching layer 114 is magnetically pinned by the AFM layer 113 in a direction 120. In the illustrated sensor, the stitching layer 114 comprises a layer of CoFe that provides a material transition between the AFM material layer 113 and the pinned layer 108. In other cases, the stitching layer 114 comprises a tri-layer of a first layer of a soft magnetic material such as CoFe, a second layer of Ru, Cr, Ag, or Au, or other suitable non-magnetic material, and a third layer of the soft magnetic material, such as CoFe. The non-magnetic material may a thickness approximately equal to the first or second oscillatory peak of the exchange coupling between the two soft magnetic layer of the multilayer. These thicknesses increase the pinning strength provided by the layer 114. For example, for a CoFe/Ru/CoFe multilayer stitching layer 114, the Ru thickness is either approximately 4.3 Å for the first oscillatory peak or between approximately 7 and 8 Å for the second oscillatory peak. In some cases, the stitching layer 114 may be omitted without impacting the coupling between the AFM layer 113 and the pinned layer 108.

A second pinned layer 108 is disposed on the antiferromagnet exchange biased pinned layer 114 along its area and on the seed layer 115 along the shield 116 contact area. The second pinned layer 108 has its magnetic direction fixed by the stitching layer 114. The second pinned layer 108 extends from the ABS 104 to the rear edge of the first pinned layer 114. The pinned layer 108 may comprise conventional pinned layer materials. For example, the pinned layer 108 may have a composite, multilayer structure including a first ferromagnetic layer 110, a non-magnetic layer 109, and a second ferromagnetic layer 107. The ferromagnetic layers 110 and 107 of pinned layer 108 may be composed of conventional ferromagnetic materials such as NiFe, CoFe, or CoNiFe. The non-magnetic layer 109 may be composed of conventional non-magnetic materials, such as Ru. In the illustrated sensor, the first and second ferromagnetic layers 107, 110 are in an anti-parallel configuration 118, 119, which is fixed by the orientation 120 of the first pinned layer 114.

The TMR read sensor further comprises a free layer 105 separated from the pinned layer 108 by a barrier layer 106 and separated from the top shield layer 101 by a capping layer 121. The barrier layer 106, the capping layer 121, and free layer 105 extend from the ABS 104 to a stripe height distance 102. In some cases, the recess distance 112 is greater than or equal to the stripe height distance 102. In other cases, the recess distance 112 is less than the stripe height distance. The free layer 105 comprises a ferromagnetic material, such as NiFe, CoFe, or CoNiFe. The barrier layer comprises an insulating material, and may be selected to provide a seed layer for the free layer 105. For example, MgO may be used as the barrier layer 106. The capping layer 121 isolates the free layer 105 from the shield layer 101 and comprises a non-magnetic material, such as Ru, Ta, or a bilayer thereof.

A region of conventional insulating substrate material, such as AlOx 103 covers the rear portion of the pinned layer 108 and back of the stitching layer 114 and AFM layer 113. Along with the free layer 105, the material layer 103 provides a planar surface for a shield layer 101. As discussed above, this may comprise NiFe or other conventional material for TMR read sensors.

FIGS. 2A-2E illustrate a first process for making a TMR read head.

Figure 2A:
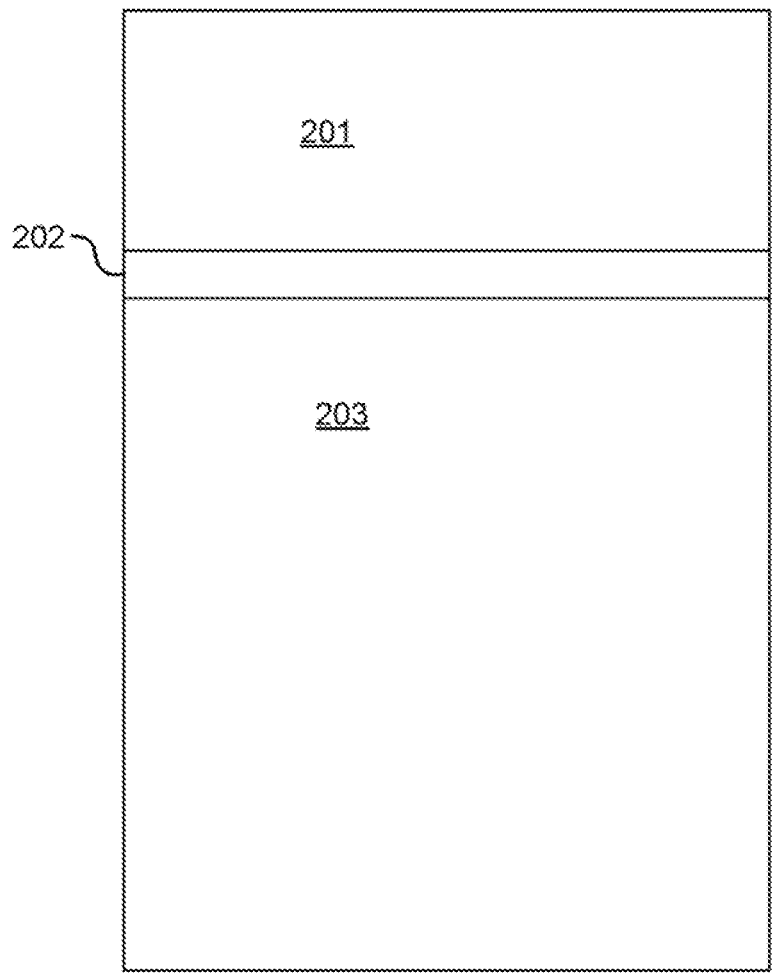
FIGS. 2A-E illustrate a process for manufacturing a read sensor having a tabbed AFM layer and extended pinned layer.

The first processing step is illustrated in FIG. 2A. Here, a shield layer 203 is provided on a substrate. A seed layer for the TMR read sensor is deposited on the shield layer 203. In some embodiments, the shield layer 203 may have a composite structure. For example, the shield layer 203 may comprise one or more alternating layers of magnetic shield material and seed layers. The layers of magnetic shield materials may comprise conventional shield materials, such as NiFe. The seed layers may comprise a material that mimic the crystal structure of the magnetic shield materials, such as a layer of CoFeB. Alternatively, the seed layer may comprise an amorphous structure that isolates the grain structure of alternating shield material layers. The TMR seed further comprises a seed layer or layers 202, 201 for the pinned layer. For example, a bilayer of tantalum 202 and ruthenium 201 may be provided as a seed for the pinned layer. As discussed below, a further process step involves cleaning the assembly by material, so the uppermost layer 201 of the seed layer is sufficiently thick so that a proper thickness remains after planarization. In a particular case, the Ta layer 202 may be 10 nm thick and the Ru layer 201 may be 60 nm thick.

Figure 2B:
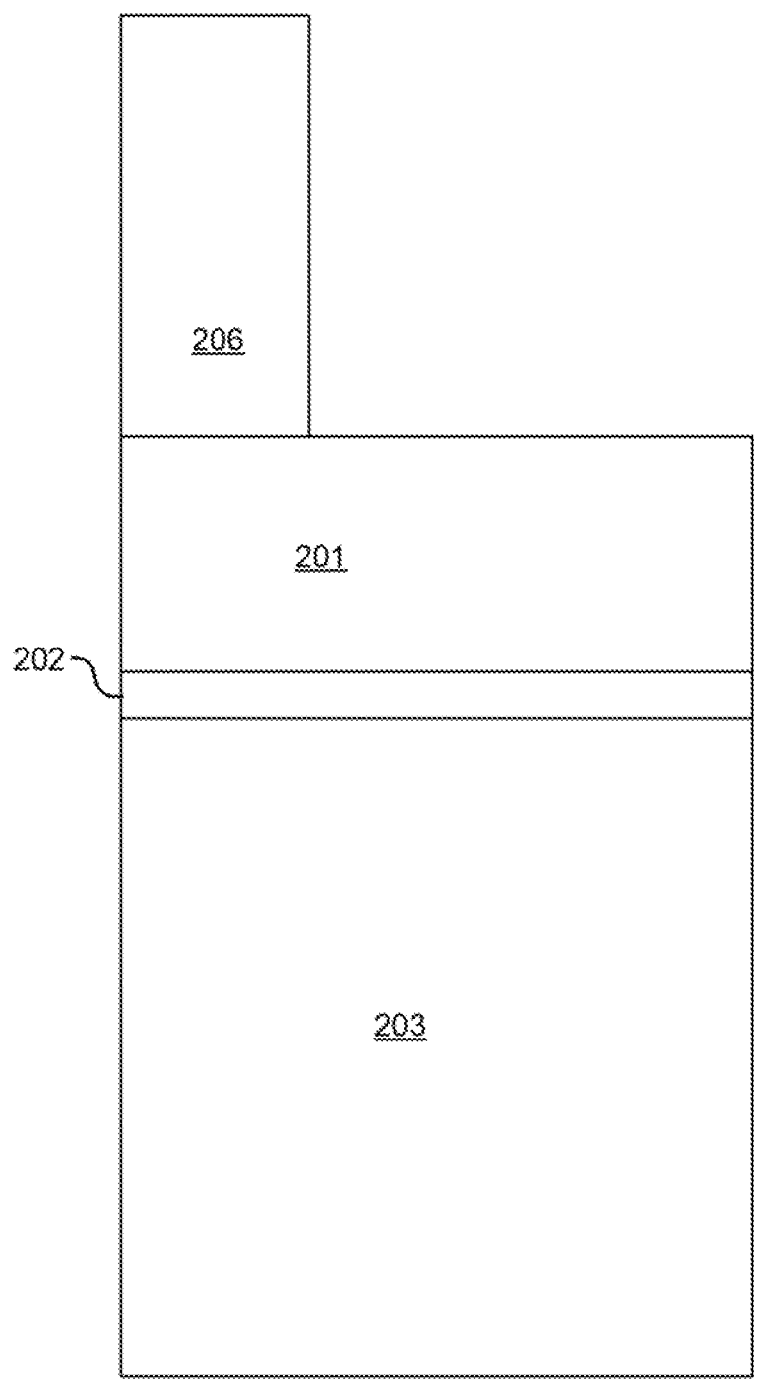

FIG. 2B illustrates a second process step of the first method for making a TMR read head. In this process step a layer of photoresist 206 is formed on the substrate assembly. The photoresist pattern 206 is configured for formation of a region for the AFM layer that is recessed from the ABS.

Figure 2C:
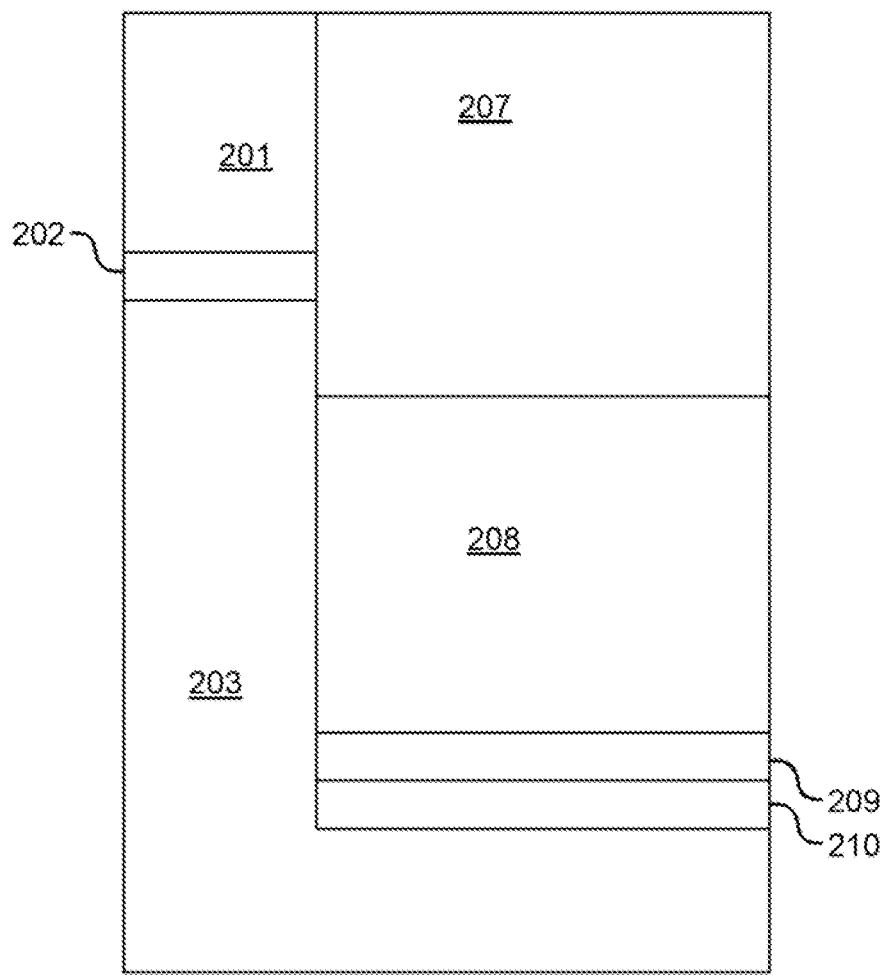

FIG. 2C illustrates a third process step of the first method for making a TMR read head. Here, the substrate assembly is etched to form a region for the AFM and the AFM is deposited in the region. The step of etching comprises etching through the seed layers 201, 202 into the shield layer 203. The depth of penetration into the shield layer is configured according to the desired height of the AFM layer. After deposition, the photoresist pattern 206 is removed. In the illustrated method, the AFM includes an AFM seed layer 210, 209. The AFM seed layer 210, 209 comprises a bilayer of Ta 210 and Ru 209. An AFM material layer 208 is deposited on the seed layer 209, 210. Then, a soft magnetic stitching layer 207 is deposited on the AFM material layer 208. Similar to the thickness of the upper seed layer 201, the thickness for the stitching layer 207 is configured according to the amount of material removal to occur during the subsequent cleaning step.

In a particular case, the first seed layer may comprise 10 nm of Ta, the second seed layer may comprise 10 nm of Ru, the AFM material layer may comprise 80 nm of IrMn, and the stitching layer may comprise 100 nm of CoFe. In this case, the depth of penetration into the shield layer 203 is 130 nm.

Figure 2D:
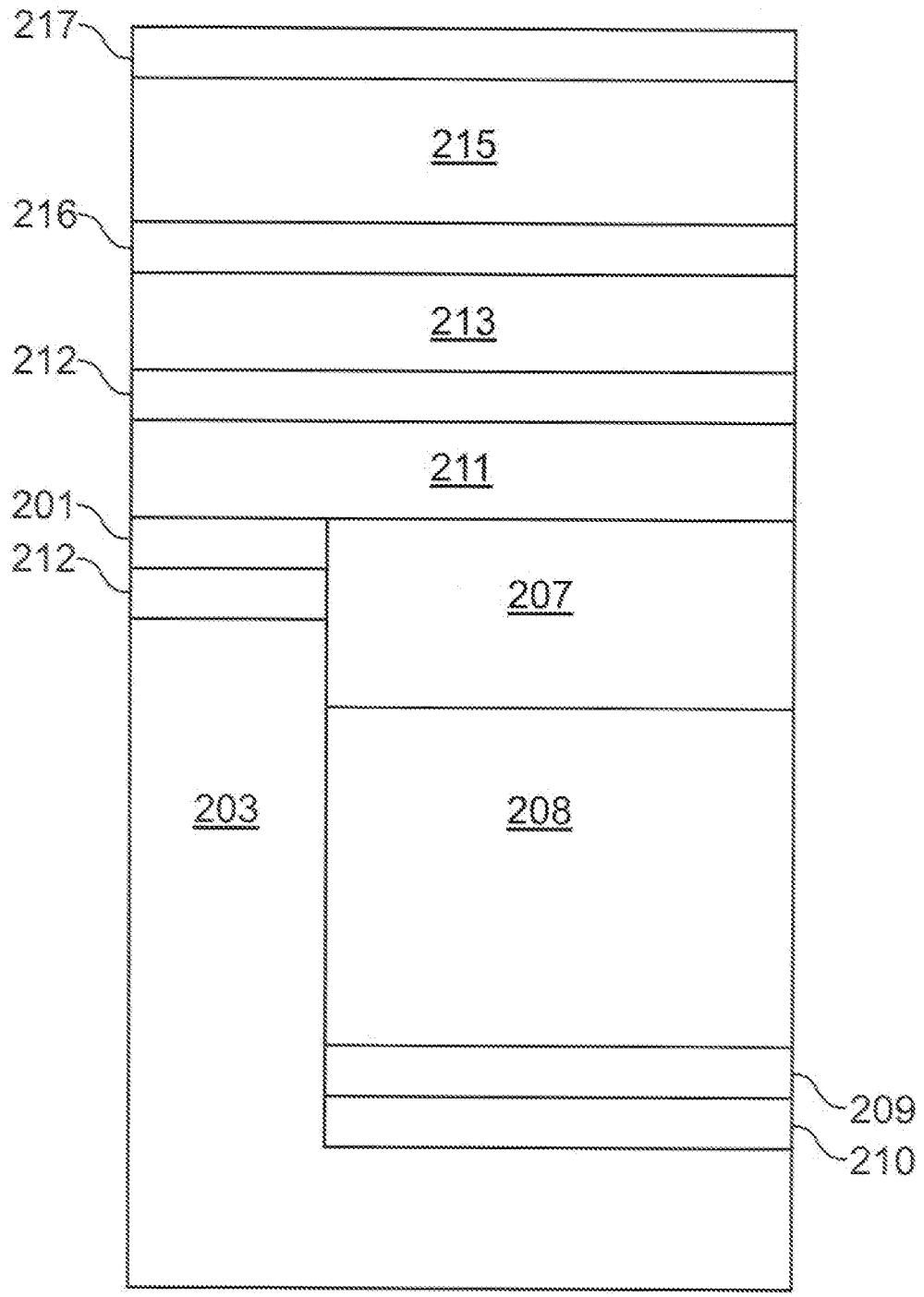

FIG. 2D illustrates a fourth process step of the first method for making a TMR read head. In this process step, the pinned layer, free layer, and attendant layers are deposited on the substrate assembly. First, the upper layers of the assembly are cleaned by removal of some of the material of the layers—for example, by sputter etch clean removal of 50 nm of material. After cleaning, the first magnetic layer 211, the non-magnetic layer 212, and the second magnetic layer 213 are sequentially deposited. The seed layer 216 is then deposited on the second magnetic layer 213. The free layer 215 is deposited on the seed layer 216. Then, the capping layer 217 is deposited on the free layer.

In some cases, after the capping layer 217 is deposited, the assembly is magnetically annealed. Additionally, the manufacture of the assembly up to FIG. 2C may be performed in situ or ex situ with the completion of the assembly in FIG. 2D.

Figure 2E:
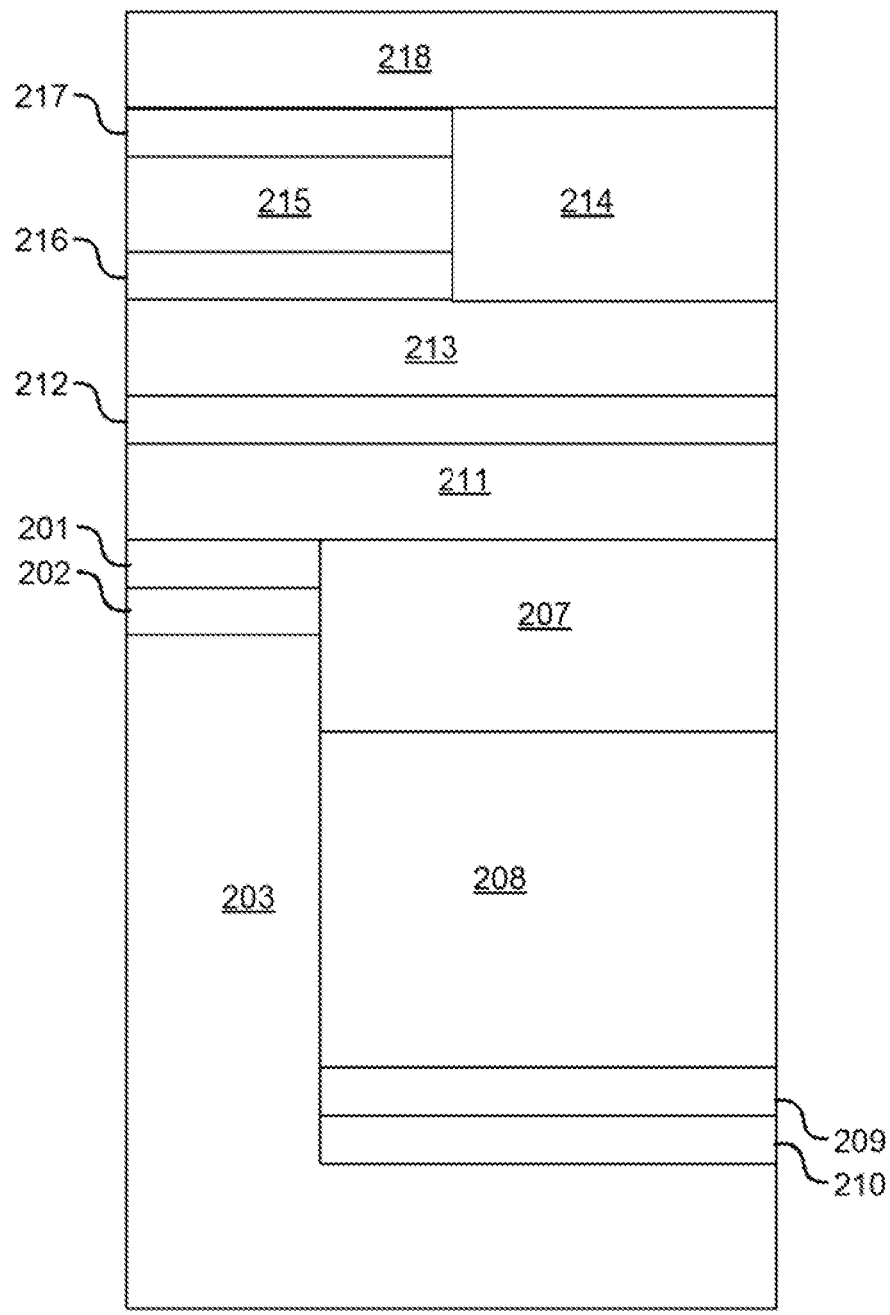

FIG. 2E illustrates a fifth process step of the first method for making the TMR read head. After the deposition of the head layers up to the capping layer 217, conventional subsequent processing is performed on the assembly to define the stripe height and track width. During these subsequent processing steps, the free layer 215, capping layer 217, and seed layer 216 are etched to the proper profile for the track width and stripe height. A filling material 214, such as AlOx is deposited on the substrate to provide a planar region for the upper shield layer 218. Finally, the upper shield layer 218 is deposited on the substrate.

FIGS. 3A-3E illustrate a second method for making a TMR read head.

Figure 3A:
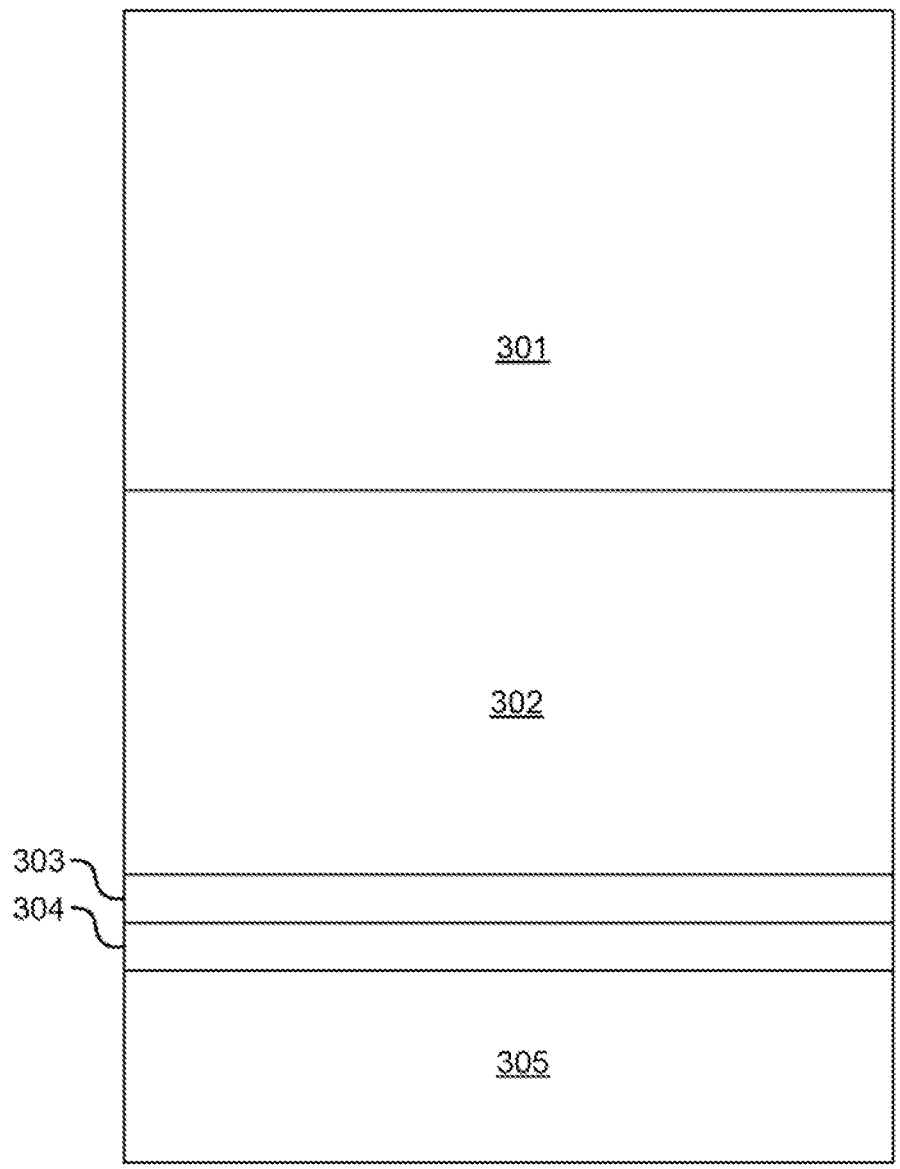
FIGS. 3A-E illustrate a second process for manufacturing a read sensor having a tabbed AFM layer and extended pinned layer.

FIG. 3A illustrates a first process step of the second method of making a TMR read head. The second method begins by depositing the AFM layer on the shield 305. Similar to FIG. 2C, the AFM layer comprises a seed layer 304, 303, such as a Ta/Ru bilayer, an AFM material layer 302 and a soft stitching layer 301. The AFM layer is deposited with similar thicknesses as the AFM layer in FIG. 2C. For example, in a particular case, the AFM film stack comprises 10 nm of Ta 304, 10 nm of Ru 303, 80 nm of IrMn, and 100 nm of CoFe.

Figure 3B:
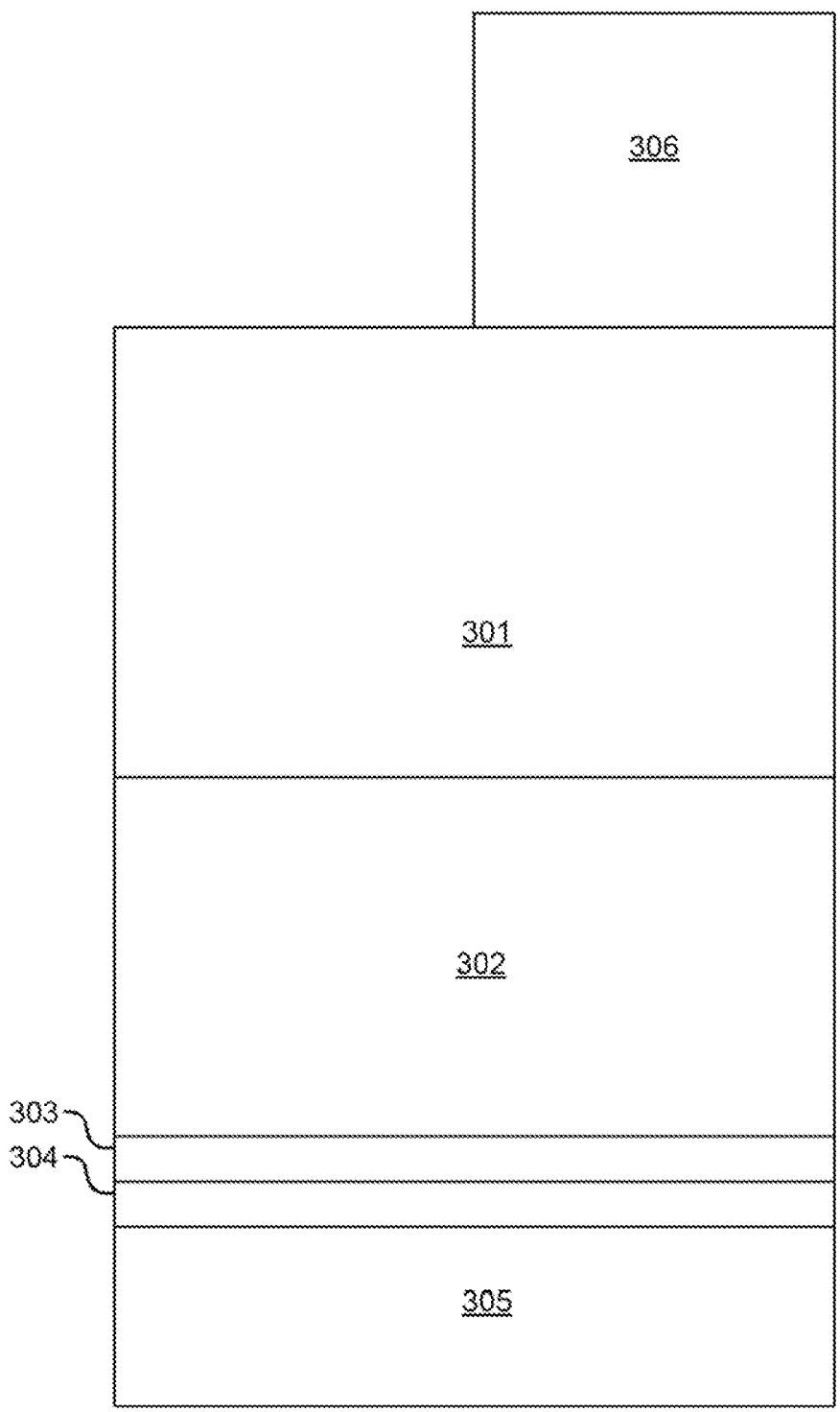

FIG. 3B illustrates a second process step of the second method of making a TMR read head. In this method, a photoresist pattern 306 is formed on the upper layer 301 of the AFM layer. The photoresist pattern 306 is configured to provide a region for formation of a TMR read head seed layer such that the remaining AFM layer is recessed from the ABS.

Figure 3C:
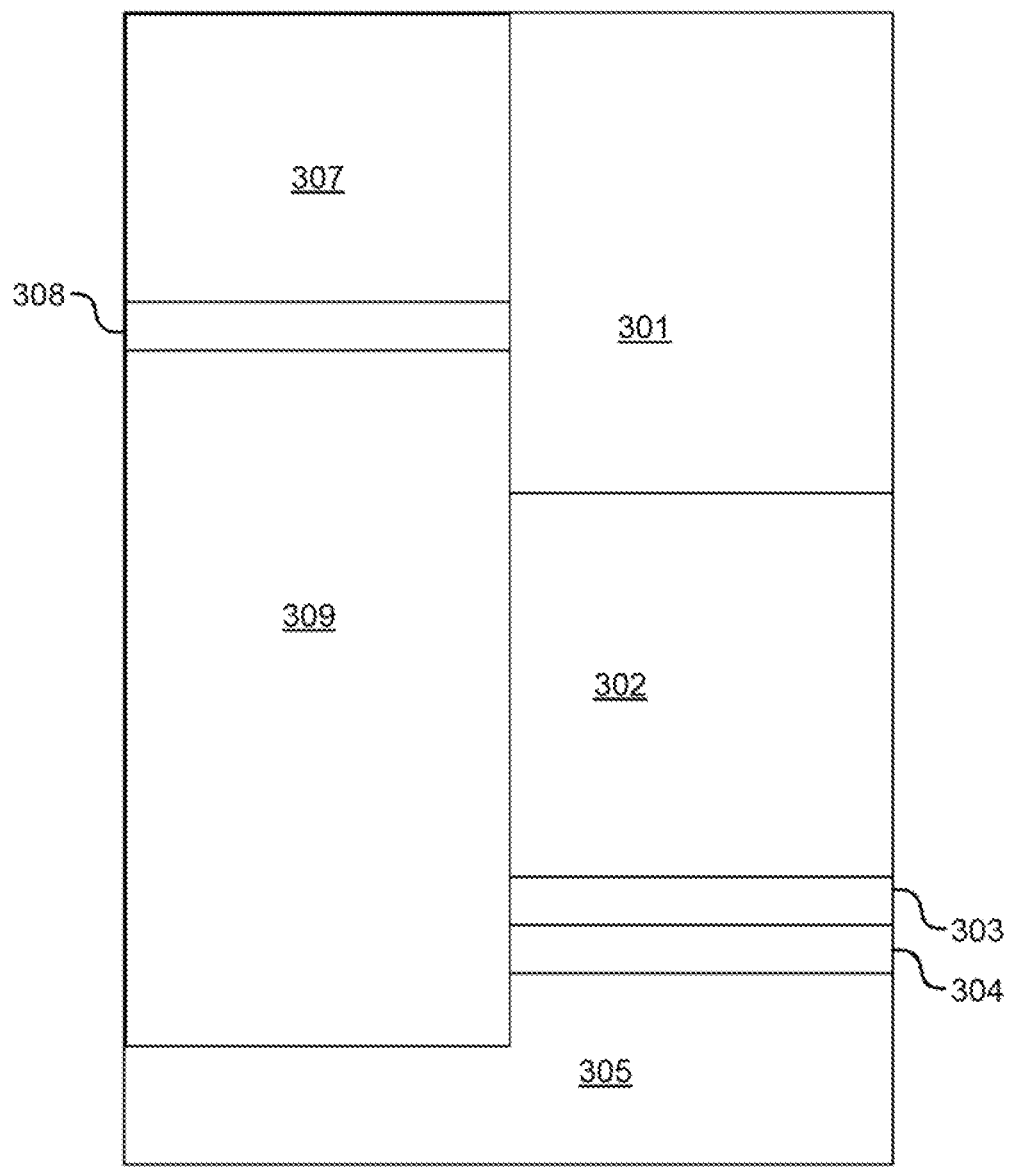

FIG. 3C illustrates a third process step of the second method of making a TMR read head. In this step, the assembly is etched to a predetermined depth into the shield 305. A layer of shield material 309 is deposited in the region to a thickness such that the shield material layer 309 is as thick as that in the second method. A TMR seed bi-layer 308, 307 is then deposited on the shield material layer 309. In some cases, a seed layer, such as a CoFeB layer is deposited on the shield layer 305 prior to the deposition of the shield material layer 309. As with the first method, the second seed layer 307 has a thickness configured for etch cleaning.

In a particular case, the TMR seed layer comprises 150 nm of NiFe, 10 nm of Ta and 60 nm of Ru.

Figure 3D:
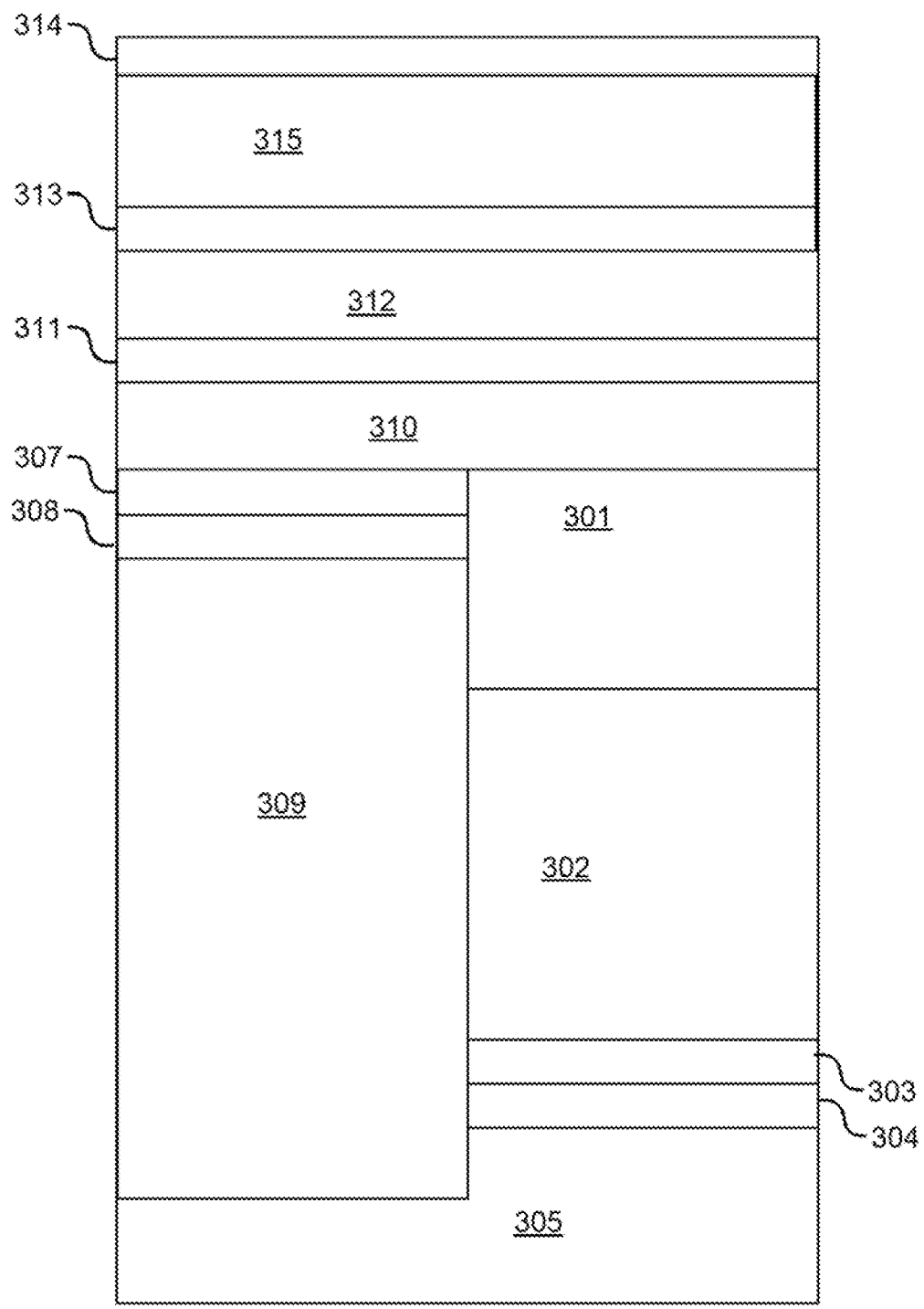

FIG. 3D illustrates a fourth process step of the second method of making a TMR read head. The fourth process step proceeds similarly to the fourth process step of the first method. Like the fourth process step of the first method, this process can be performed in situ or ex situ with the third process step. An etch cleaning step removes a certain thickness of material from the uppermost layers—for example, 50 nm. Next, a pinned layer comprising a first ferromagnetic layer 310 and a second ferromagnetic layer 312 sandwiching a non-magnetic layer 311 is deposited on the substrate assembly after cleaning. Afterwards, a seed layer 313, free layer 315 and capping layer 314 are deposited on the pinned layer. In some cases, the assembly is then magnetically annealed.

As in the first method, after the capping layer 314 is deposited, the assembly may be magnetically annealed. Additionally, the manufacture of the assembly up to FIG. 3C may be performed in situ or ex situ with the completion of the assembly in FIG. 3D.

Figure 3E:
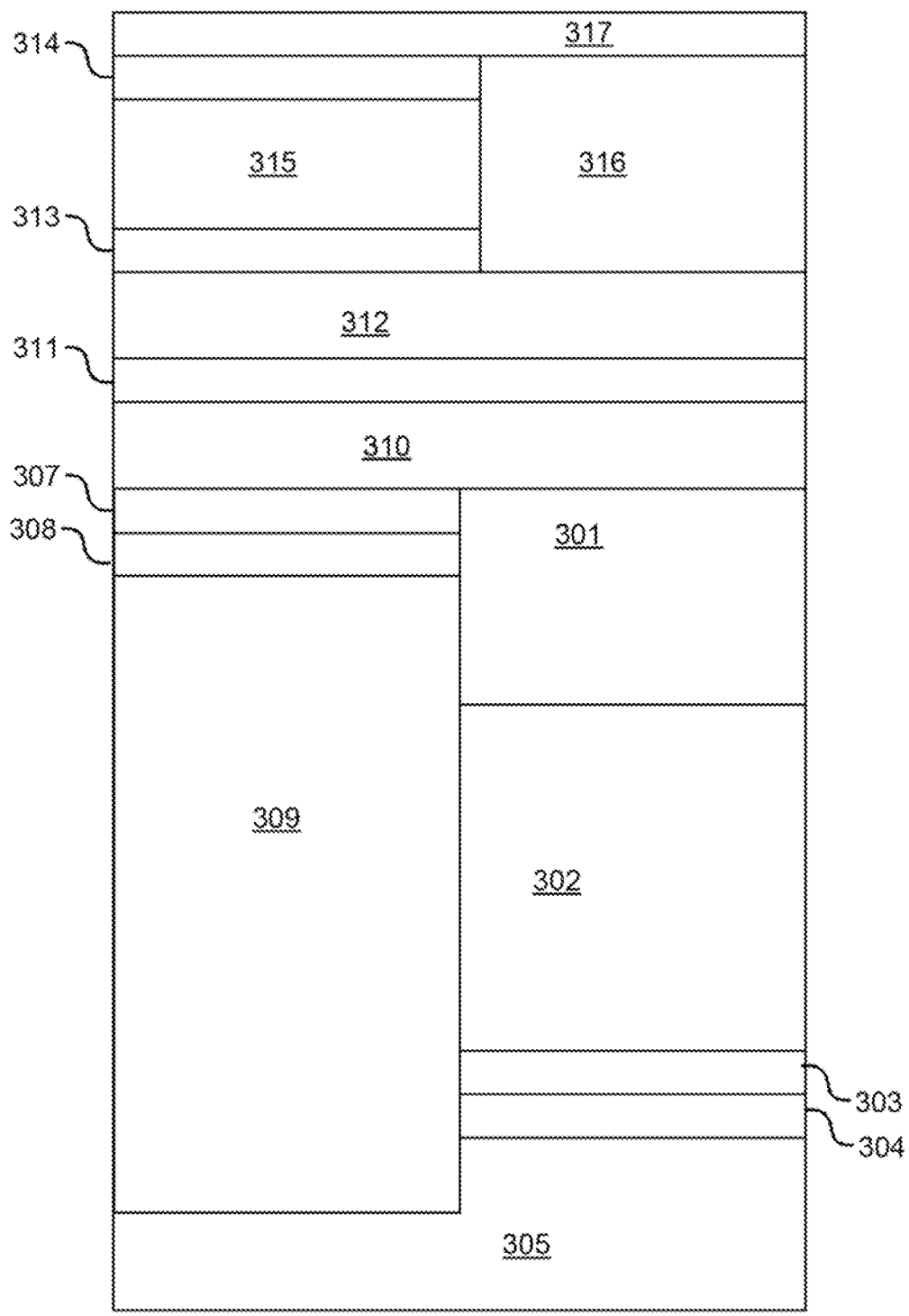

FIG. 3E illustrates a fifth process step of the second method of making a TMR read head. This process proceeds in a substantially similar manner as described above with respect to FIG. 2E. After the track height and stripe width of the free layer 315 are defined, a filling material 316 is deposited to form a planar region with the capping layer 314 and a top shield layer 317 are deposited on layers 314 and 316.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A read sensor comprising:
    a shield layer intersecting an air bearing surface plane;
    an antiferromagnetic layer disposed over the shield layer;
    an antiferromagnet exchange biased first pinned layer disposed over the antiferromagnetic layer, the antiferromagnetic layer and antiferromagnet exchange biased first pinned layer being recessed from the air bearing surface plane;
    a second pinned layer disposed over and magnetically coupled to the antiferromagnet exchange biased first pinned layer, the second pinned layer intersecting the air bearing surface plane;
    a barrier layer disposed over the second pinned layer and intersecting the air bearing surface plane;
    a free layer disposed over the barrier layer and intersecting the air bearing surface plane; and
    a capping layer disposed over the free layer and intersecting the air bearing surface plane.

2. The read sensor of claim 1, wherein:
    the free layer extends to a stripe height distance from the air bearing surface plane;
    the antiferromagnetic layer and the antiferromagnet exchange biased first pinned layer are recessed from the air bearing surface plane by at least the stripe height distance; and
    the second pinned layer extends beyond the free layer back edge to approximately the same length as the antiferromagnet exchange biased first pinned layer.

3. The read sensor of claim 1, wherein the antiferromagnetic layer and the antiferromagnet exchange biased first pinned layer are recessed from the air bearing surface plane by between 10 nm and 500 nm.

4. The read sensor of claim 1, wherein the antiferromagnet exchange biased first pinned layer comprises a soft magnetic stitching layer disposed over the antiferromagnetic layer.

5. The read sensor of claim 4, wherein the antiferromagnetic layer comprises IrMn, PtMn, PdPtMn, NiMn, RhMn, or RhRuMn.

6. The read sensor of claim 4, wherein the soft magnetic stitching layer comprises CoFe, NiFe, or CoNiFe.

7. The read sensor of claim 4, wherein the soft magnetic stitching layer comprises a multilayer comprising:
    a first soft ferromagnetic layer;
    a second soft ferromagnetic layer disposed over the first ferromagnetic layer; and
    a non-magnetic layer disposed between the first soft ferromagnetic layer and the second soft ferromagnetic layer;
    the non-magnetic layer having a thickness approximately equal to a first or a second oscillatory peak of the exchange coupling between the first soft ferromagnetic layer and the second soft ferromagnetic layer; and
    the non-magnetic layer comprising Ru, Cr, Ag, or Au.

* * * * *